United States Patent [19]

Hodge et al.

[11] Patent Number: 5,527,765
[45] Date of Patent: Jun. 18, 1996

[54] SUPERCONDUCTING $YBA_2CU_3O_{7-x}$ PRODUCED AT LOW TEMPERATURES

[75] Inventors: James D. Hodge; Lori J. Klemptner, both of Lincolnwood, Ill.

[73] Assignee: Illinois Superconductor Corporation, Mt. Prospect, Ill.

[21] Appl. No.: 294,486

[22] Filed: Aug. 23, 1994

Related U.S. Application Data

[62] Division of Ser. No. 10,932, Jan. 29, 1993, Pat. No. 5,340,797.

[51] Int. Cl.$^6$ ............................. H01L 39/12; B32B 9/00
[52] U.S. Cl. .................... 505/236; 505/126; 505/450; 505/500; 428/469; 428/471; 428/930; 423/593; 423/604; 423/635; 427/62
[58] Field of Search ................................. 505/238, 236, 505/450, 500, 126; 423/593, 604, 635; 427/62; 428/930, 469, 471

[56] References Cited

U.S. PATENT DOCUMENTS 5,055,436 10/1991 Klemptner et al. .
5,227,365 7/1993 Van den Sype ..................... 505/785

OTHER PUBLICATIONS

Cheung et al, J. Mater. Res., 4(1) pp. 1–15, 1989.
"Alignment of $YBa_2Cu_3O_{7-x}$ and Ag–$YBa_2Cu_3O_{7-x}$ Composites at ~ 930 C by Eutectic Formation", Zhou et al., *J. of American Ceramic Society*, vol. 74, No. 7, pp. 1541–1546, 1991.
"Oxide Systems", John D. Whitler, et al., *Phase Diagrams for High Tc Superconductors*, Compiled in the Phase Diagrams for Ceramists Data Center, National Institute of Standards and Technology, published by The American Ceramic Society, Westerville, Ohio, pp. 84–89, 1991.
"Kinetic Effects in the Preparation of $YBa_2Cu_3O_{7-x}$ by Solid State Reaction", Klemptner et al., presented at the American Ceramic Society, Electronic Materials Meeting, Arlington, VA, Oct. 22, 1991, pp. 1–29.
"Observation of Anomalous RF Dissipation in Thick Films of Superconducting $YBa_2Cu_3O_{7-x}$", Zhang et al., *Physica C*, pp. 51–58, 1992.
"Processing of Bulk YBaCuO", Murakami, *Superconductor Science & Technology*, No. 4, Apr. 1992, pp. 185–203.
"The Effects of Second Phase Additions (SiC, $BaZrO_3$, $BaSnO_3$) on the Microstructure and Superconducting Properties of Zone Melt Textured $YBa_2Cu_3O_{7-x}$", Chakrapani et al., *Applied Superconductivity*, Jan. 1993, pp. 15–19.
"Preferential Orientation of Oxide Superconducting Materials to Enhance Current–Carrying Properties", Capone et al., Chemistry high Tc Superconductors, 1987, pp. 264–265.
"Preparation of a High–$J_c$ YBCO Bulk Superconductor by the Platinum Doped Melt Growth Method," N. Ogawa et al., Physica C, 177 (1991), pp. 101–105.
"Microstructure and Critical Current Density of Zone Melt Textured $YBa_2Cu_3O_{6+x}/Y_2BaCuO_5$ with $BaSnO_3$ Additions," P. McGinn et al., Appl. Phys. Lett., 59(1), 1 Jul. 1991, pp. 120–122.
"The Peritectic Reaction," D. H. St. John, Aeta Metall. Mater., vol. 28, No. 4, pp. 631–636, 1990.
"The Effect of $Er_2BaCuO_5$ Additions on the Microstructure and Magnetic Properties of Zone Melt Textured $YBa_2Cu_3O_{6+x}$ Wires," D. Balkin et al., submitted to proceedings of 1992 Spring MRS Meeting, Apr. 1992, pp. 1–9.
"Production of Continuous Filaments of Melt–Textured $YBa_2Cu_3O_{7-\delta}$ Superconductor," J. D. Hodge et al., Journal of Materials Science Letters, 10 (1991), pp. 1362–1365.
"Preparation and Substrate Reactions of Superconducting Y–Ba–Cu–O Films," M. Gurvitch et al., Appl. Phys. Lett., vol. 51, No. 13, 28 Sep. 1967, pp. 1027–1029.

*Primary Examiner*—Roy V. King
*Attorney, Agent, or Firm*—Reinhart, Boerner, Van Deuren, Norris & Rieselbach

[57] ABSTRACT

A high temperature superconductor and composite structure. A superconductor is disposed on a silver substrate without interdiffusion. The superconductor is formed by heating to a temperature not exceeding the peritectic point of the superconductor material, providing an oxidizing atmosphere while not exceeding the melting point of silver and disposing the superconductor on the silver substrate.

14 Claims, 7 Drawing Sheets

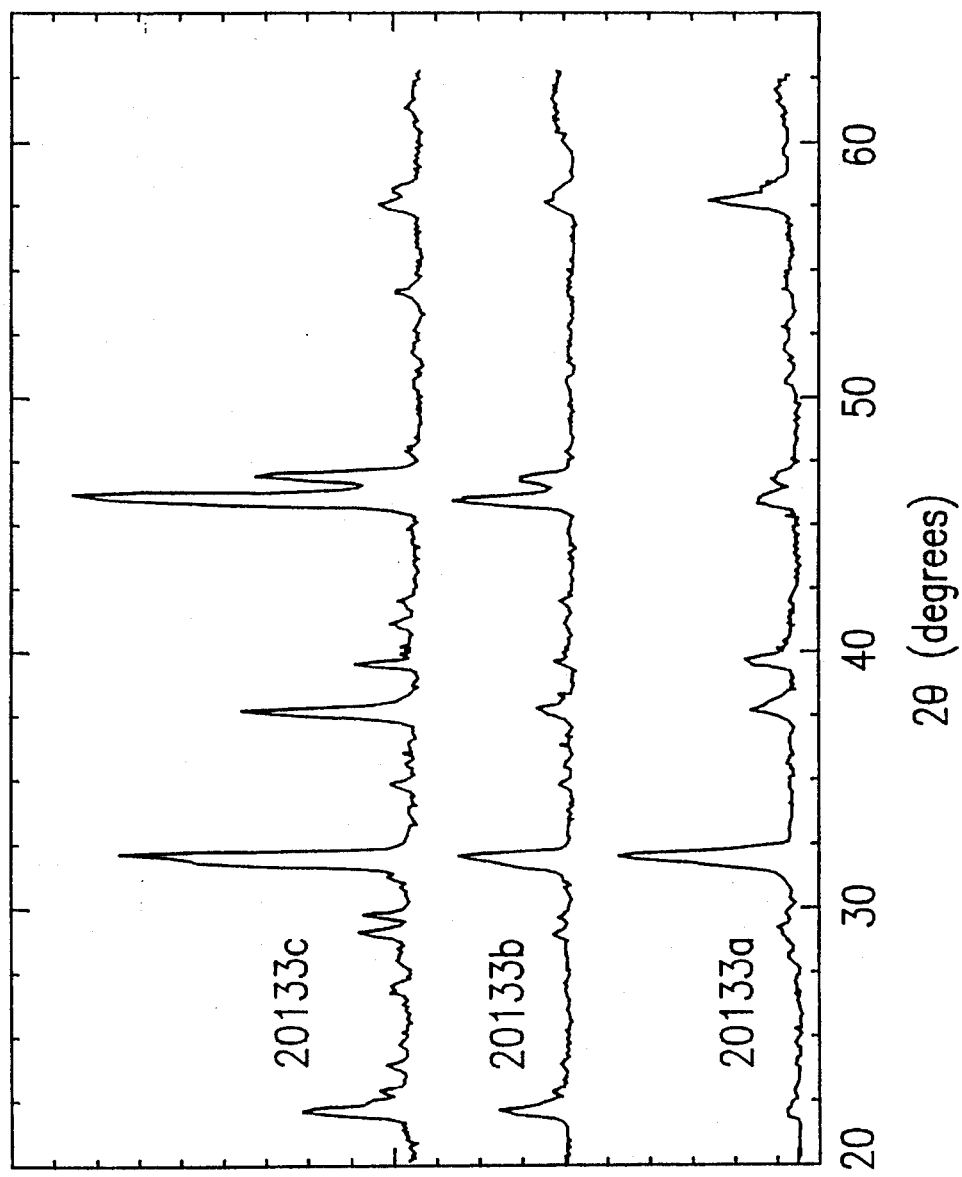

SUPERCONDUCTING $YBA_2CU_3O_{7-x}$ PRODUCED AT LOW TEMPERATURES

This is a divisional of copending application Ser. No. 08/010,932, filed on Jan. 29, 1993, now U.S. Pat. No. 5,340,797.

BACKGROUND OF THE INVENTION

This invention was developed at least in part under U.S. Air Force Contract F19628-91-C-0082, and the U.S. government has certain rights in this invention pursuant to this contract.

The present invention relates generally to a superconductor material. More particularly, the invention relates to a textured, high temperature superconductor ceramic ("HTSC") material and a method of producing this material at low temperatures.

High temperature superconducting ceramics (HTSC) are intrinsically weak and brittle materials. In addition, conventional ceramic processing of these materials produces polycrystalline bodies which have low critical current densities ($j_c$, in DC measurements) and high surface resistivities ($R_s$, in RF measurements). Commercial applications of these materials require components that exhibit high $j_c$ and/or low $R_s$ values as well as the capability of producing mechanically strong and easy to manufacture components. Due to the materials' low mechanical strength, commercially useful structures cannot be produced without the use of a substrate to impart strength and toughness to the superconductor. This is especially true for lower frequency RF devices that will require the superconductor to be formed into relatively large, complex shapes. HTSC thin films have been shown to have high current densities and low $R_s$ values. However, these films are not useful for low frequency RF applications because they require expensive single crystal substrates (typically, $LaAlO_4$ or $SrTiO_4$) and can only be formed into planar structures with dimensions under a few inches.

Bulk HTSC materials with highly textured microstructures can exhibit the level of electrical performance required for commercial applications. For $YBa_2Cu_3O_{7-x}$, such textured microstructures are produced using a method called peritectic recrystallization or, more commonly, "melt-texturing". In this process, "textured" $YBa_2Cu_3O_{7-x}$ is produced by crystallizing this compound out of its peritectic mixture of $Y_2BaCuO_5$ plus a Ba/Cu-rich liquid. Many variations of this technique have been described, and it is commonly practiced in laboratories throughout the world. However, the process remains essentially the same as that originally developed in 1988.

The melt-tearing process typically involves heating a sample above the peritectic temperature (1015° C. in air) to decompose the $YBa_2Cu_3O_{7-x}$ into $Y_2BaCuO_5$ plus liquid. This mixture is cooled slowly through the peritectic temperature allowing $YBa_2Cu_3O_{7-x}$ to crystallize. When this cooling is performed in the presence of a thermal gradient, the $YBa_2Cu_3O_{7-x}$ grains preferentially grow parallel to the gradient and a "teared" microstructure results. The slow cooling keeps the nucleation rate of $YBa_2Cu_3O_{7-x}$ low, resulting in the formation of a small number of nuclei. As a result, the $YBa_2Cu_3O_{7-x}$ grains can grow to very large sizes before impingement; and if the cooling is performed in a thermal gradient, the grains will be highly aligned. In the originally developed process samples were measured to have critical currents of up to 17,000 A/cm² in self-field with only a small magnetic field dependence. Improvements to this process (which have included the production of continuous lengths of melt-textured filaments) have resulted in measured current densities as high as 140,000 A/cm² in self field and 44,000 A/cm² in a 1 Tesla field at 77K.

While the melt-texturing process has proven to be very effective in the fabrication of bulk $YBa_2Cu_3O_{7-x}$ having properties approaching those of thin film materials, it has substantial drawbacks. First, melt-texturing is essentially a crystal growth process in which the rate of material production is controlled by the velocity of the crystallization front. In the case of $YBa_2Cu_3O_{7-x}$ crystallizing out of its peritectic mixture, the crystallization rate is extremely sluggish. Even in extremely large thermal gradients ($10^7$K/m) growth rates of only 1.2 cm/hr have been achieved. A second problem, of particular importance to texturing thick film structures, is the fact that the melt-texturing process requires processing at temperatures above 1000° C. in the presence of the extremely reactive peritectic liquid. This severely limits the choice of substrate materials that can be used without reacting with the superconductor. To date, only zirconia and magnesia have been used with any degree of success, and these ceramics are expensive and difficult to process.

It is therefore an object of the invention to provide an improved method of producing a high temperature superconductor (HTSC) material.

It is a further object of the invention to provide a novel method of producing an HTSC material at relatively low temperatures with very high rate of production.

It is another object of the invention to provide an improved method of producing HTSC structures on relatively inexpensive substrates.

It is yet a further object of the invention to provide a novel HTSC article of manufacture.

It is still an additional object of the invention to provide an improved method of manufacturing HTSC material and an article of manufacture having relatively intricate patterns formed directly from the process.

It is still another object of the invention to provide a novel HTSC article of manufacture of an intermediate phase state having minimal liquid involved in its manufacture.

Further objects and advantages of the present invention, together with the organization and manner of operation thereof, will become apparent from the following detailed description of the invention when taken in conjunction with the accompanying drawings, wherein like elements have like numerals throughout the drawings.

BRIEF DESCRIPTION OF THE DRAWINGS

FIG. 4B shows X-ray diffraction patterns for three crystalline $YBa_2Cu_3O_{7-x}$ samples;

DETAILED DESCRIPTION OF PREFERRED EMBODIMENTS

Figure 1:
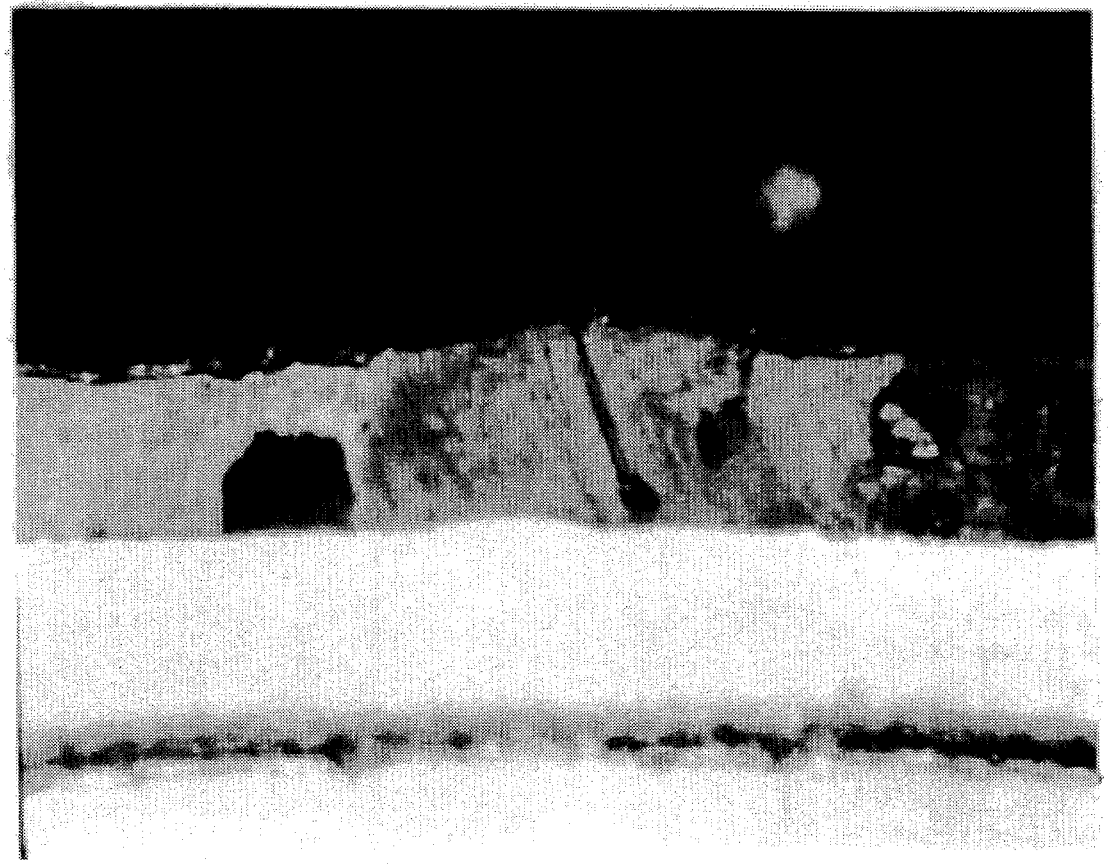
FIG. 1 illustrates a 40X magnification microstructure of reactively textured $YBa_2Cu_3O_{7-x}$ on silver buffered stainless steel.
Figure 2:
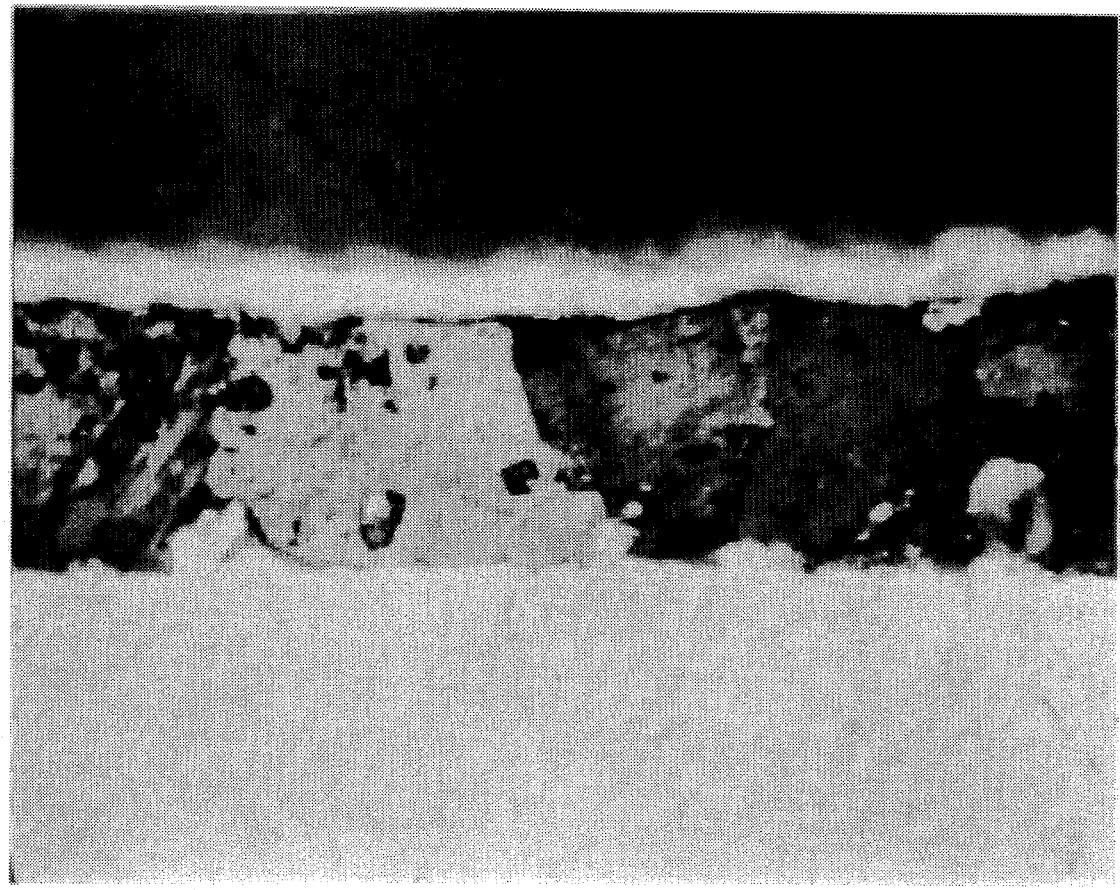
FIG. 2 shows a reactively textured $YBa_2Cu_3O_{7-x}$ on a silver substrate at 40X magnification.
Figure 3:
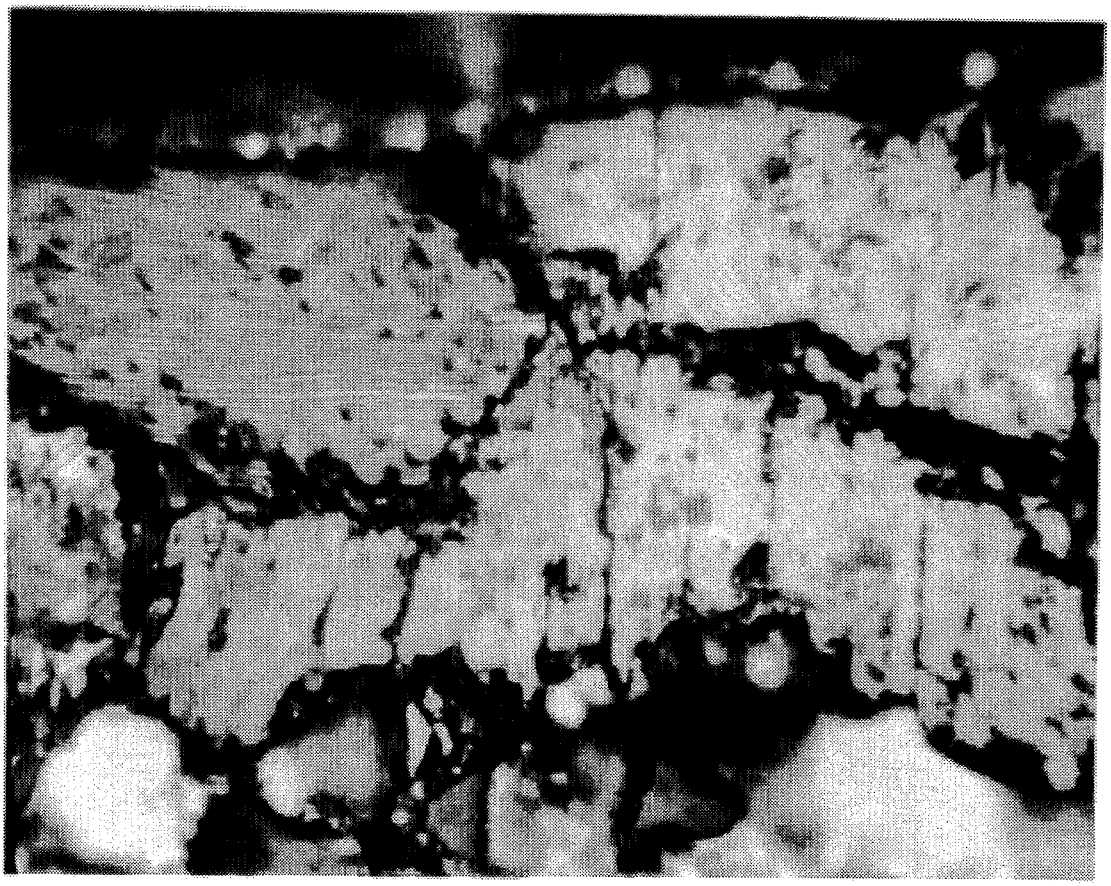
FIG. 3 illustrates a conventional peritectic recrystallized thick film microstructure on a zirconia substrate.
Figure 4A:
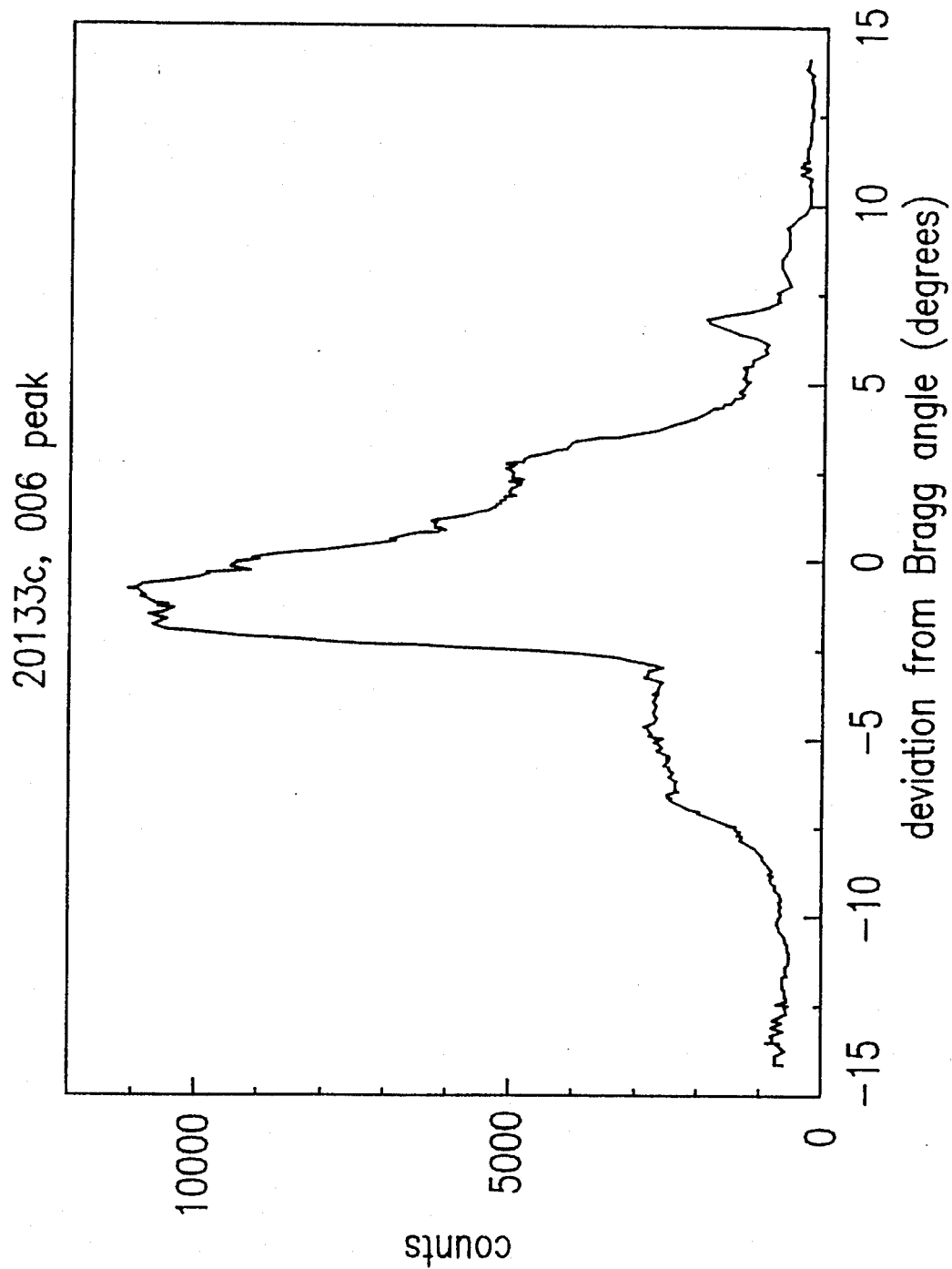
FIG. 4A illustrates an exemplary rocking angle X-ray diffraction curve showing the highly textured nature of an HTSC material prepared by one of the methods of the invention.

A process in accordance with one form of the invention involves the crystallization of $YBa_2Cu_3O_{7-x}$ out of a metastable liquid formed by rapidly introducing a non-equilibrium mixture of Y-, Ba- and Cu-compounds (mixed in the appropriate stoichiometry) into a combination of temperature and a gas atmosphere in which $YBa_2Cu_3O_{7-x}$ is the thermodynamically stable phase. Two general variations of this process have been successfully demonstrated. In the first general method of preparation, $Y_2O_3$, CuO, and $BaCO_3$ powders are mixed in a molar ratio of 0.5:3.0:2.0 and are heated in a $CO_2$ rich atmosphere to approximately 850° C. to 890° C. The atmosphere is then changed to 2 torr of pure oxygen. The use of a $CO_2$-rich atmosphere during heating suppresses the decomposition of $BaCO_3$ and consequently prevents $YBa_2Cu_3O_{7-x}$ from forming prematurely. When the atmosphere is rapidly changed to a reduced pressure oxygen environment, the reaction mixture begins to decompose to a partially molten state out of which $YBa_2Cu_3O_{7-x}$ crystallizes.

In a second general method of preparation, a prereacted, phase-pure $YBa_2Cu_3O_{7-x}$ powder is heated to approximately 850° C. to 890° C., also in a CO2-rich atmosphere. Without limiting the scope of the invention, it is believed the presence of the $CO_2$ causes the $YBa_2Cu_3O_{7-x}$ to decompose into a complex mixture of oxides and oxycarbonates. As for the first general method, the atmosphere is changed at temperature to a reduced pressure oxygen containing atmosphere, which causes this mixture to decompose into the partially molten state from which $YBa_2Cu_3O_{7-x}$ can crystallize.

In accordance with one form of the invention, this 'reactive texturing' process is preferably carried out on either a silver foil or a base metal, such as a stainless steel, which has been electroplated with either silver or silver with a nickel intermediate layer. In this embodiment the silver or silver/nickel buffer layers are necessary since $YBa_2Cu_3O_{7-x}$ and its precursors are relatively active compounds which react strongly with most base metals. Silver is relatively inert with respect to $YBa_2Cu_3O_{7-x}$. This silver or silver/nickel buffer layer is preferably at least 0.002" thick to protect the superconductor. Base metals which have proven satisfactory include stainless steels, such as 302 stainless steel, 304 stainless steel, 316 stainless steel and also Inconel 600. The process has been practiced on a variety of shapes, including discs, tubes, wires and coils. Copper can also be used in this temperature range. The successful use of copper as a substrate requires use of an appropriate intermediate metal which will prevent interdiffusion of copper, silver and oxygen.

The substrate can be coated with the precursor slurry of appropriate stoichiometry using either painting, dipping, spraying, or any other technique currently used to apply thick film coatings or patterns. It has been determined that the preferred thickness of this applied coating is about 0.002" to 0.008". The preferred thermal processing has three steps:

1. Binder/organic removal. Heating of the coating is preferably carried out in a reduced total pressure oxygen environment (e.g., 2 torr of oxygen) heated at a rate of between 30° C./hr and 300° C./hr from room temperature to a temperature between 350° C. and 500° C. which is sufficient to removal the volatile components of the precursor paint.

2. Reaction suppression/precursor formation. Heating of the coating is preferably performed at a rate of about 300° C./hr. in a nitrogen atmosphere containing between at least about 0.8% and 2.8% $CO_2$. One can use higher pressures of $CO_2$, but such higher pressures are more than needed to suppress the decomposition of $BaCO_3$ or initiate the decomposition of $YBa_2Cu_3O_{7-x}$. The $CO_2$ can be mixed with any inert gas, such as $N_2$, argon or helium. The temperature is preferably between the temperature of the binder removal stage and the temperature of the crystallization stage. These temperatures are sufficient to suppress the formation of $YBa_2Cu_3O_{7-x}$ in the case of an oxide/carbonate precursor or decompose the $YBa_2Cu_3O_{7-x}$ precursor to an appropriate mixture of oxides and oxycarbonates.

3. Crystallization. A preferred window for crystallization of $YBa_2Cu_3O_{7-x}$ exists between about 850° C. and 900° C. in an atmosphere of about 1 to 3 torr of oxygen, although the oxygen pressure can range up to one atmosphere pressure. Below about 850° C., the grain sizes are greatly reduced in size. It should also be noted that at higher oxygen partial pressures, the process temperature increases such that at 0.21 atm. oxygen the temperature of treatment would be about 975° C. Preferably the process temperature is maintained below the melting point of the silver containing substrate. Most preferably, therefore, the pressure of oxygen is kept below about 50 torr to operate at a temperature below 925° C. (the melting point of silver at 50 torr). One can choose to perform the process by slowly increasing the temperature within this window during the crystallization process as opposed to using a simple isothermal hold. Either procedure is acceptable.

Figure 5:
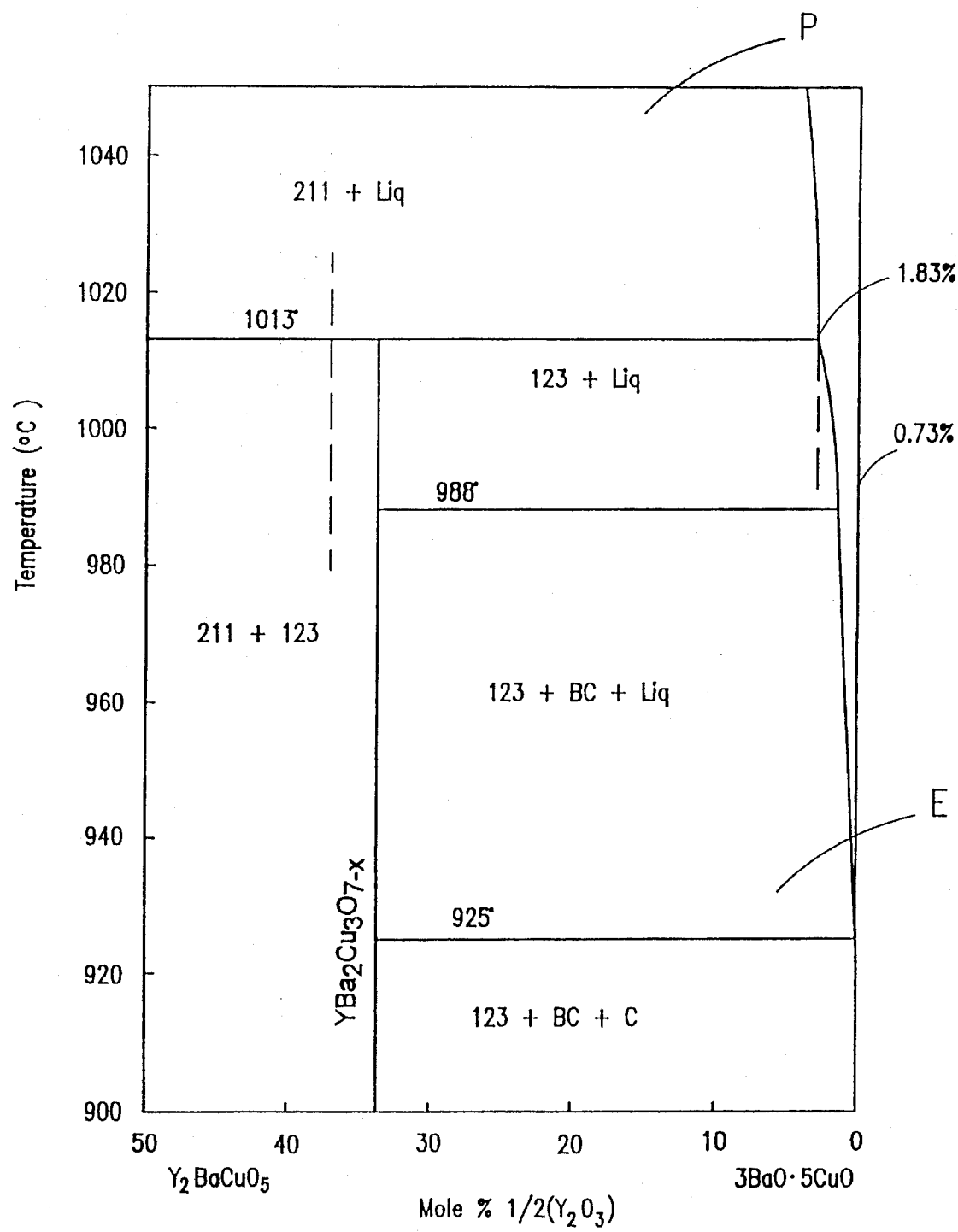
FIG. 5 illsutrates a pseudobinary phase diagram of $YBa_2Cu_3O_{7-x}$ and 3BaO0.5CuO.

In the above described preferred process an intermediate product, or article of manufacture, is obtained. In the conventional melt texturing process the peritectic zone (region P in FIG. 5) encompasses the region of the phase diagram involved in producing the desired $YBa_2Cu_3O_{7-x}$. In this conventional method the amount of liquid present is quite large throughout the processing temperature range (about 1015° C. then cooled slowly through the peritectic temperature of 1013° C.). On the other hand in the instant invention, rather than having an intermediate product of solid material and a substantial percentage of peritectic liquid, the intermediate product is primarily a solid and a small fraction of a eutectic liquid (not a peritectic liquid). Since the reactants are metastable, the liquid that forms is the lowest melting liquid in the Y-Ba-Cu-O system, that is, the ternary eutectic. Substantial advantages result from being able to prepare textured $YBa_2Cu_3O_{7-x}$ without excess liquid present. One such advantage is the ability to cast well defined solid patterns without need of liquid barriers in place. A desired pattern can be disposed on a substrate, such as by applying a thick film slurry in a desired pattern; and then the $YBa_2Cu_3O_{7-x}$ can be formed by the method of the invention without substantial liquid flowage causing loss of the shape of the desired pattern. Thus, the intermediate product of the invention formed at about 850°–900° C. does not have the undesirable large liquid component present in the conventional intermediate product formed in the peritectic region.

Figure 6:
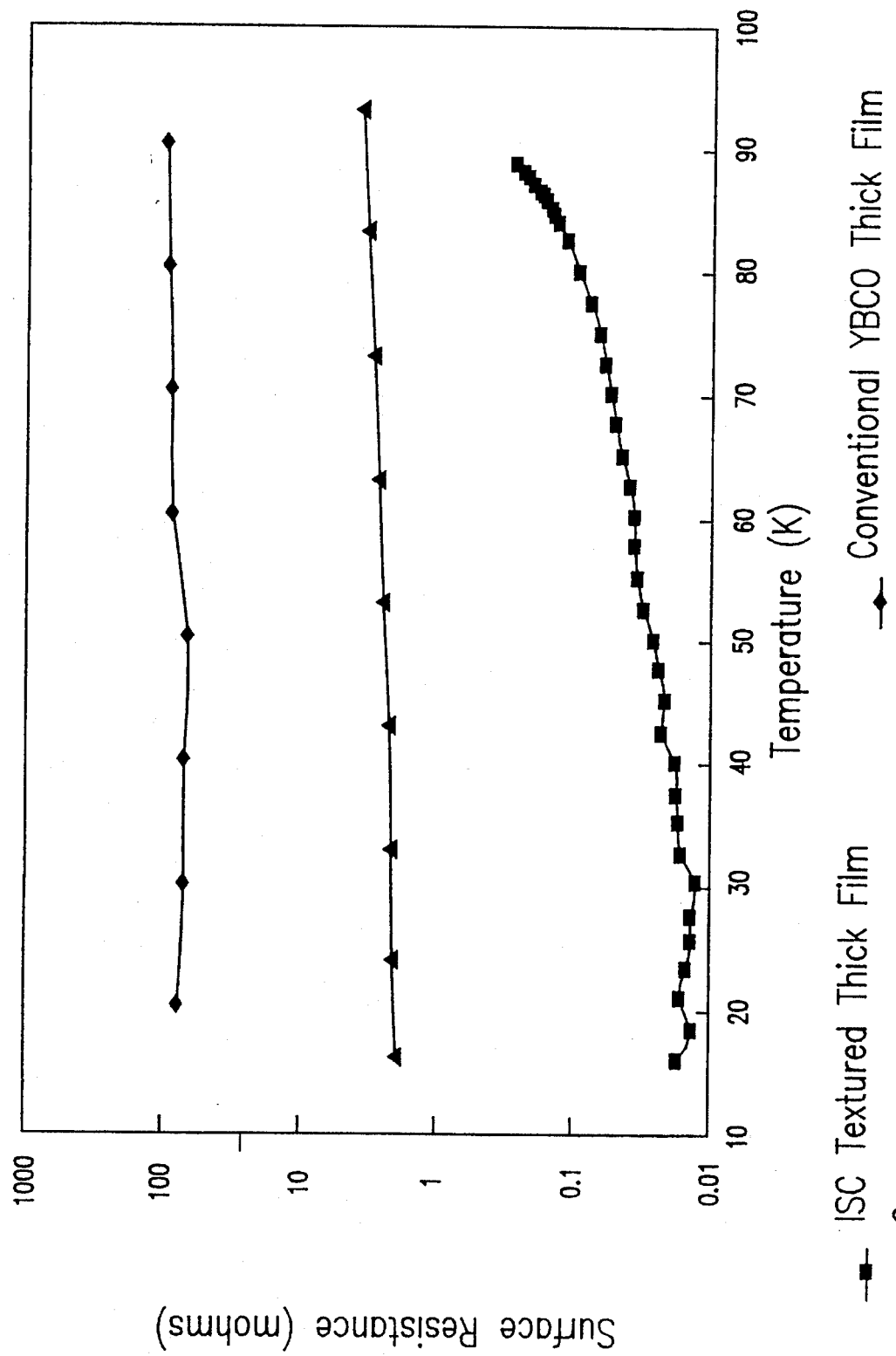
FIG. 6 shows surface RF resistivity extrapolated to 1 GHz for $YBa_2Cu_3O_{7-x}$ specimens of the invention, a prior art sintered $YBa_2Cu_3O_{7-x}$ and Cu.

A process has been described herein which produces textured $YBa_2Cu_3O_{7-x}$ microstructures, as in the peritectic recrystallization method. However, unlike peritectic recrystallization, the instant method produces these microstructures at low temperatures (less than about 900° C.) and in relatively short times (less than about 1 hr compared to 10–15 hours for conventional melt texturing). This combination of low temperatures and short times enables the use of relatively inexpensive and easy to form base metal substrates that substantially reduce the potential cost of the component. This cost reduction makes this process much more attractive for the commercial application of HTSC components. This process is especially attractive for the fabrication of three dimensional RF resonant structures which are the fundamental components of numerous RF devices such as filters, oscillators and combiners. As can be seen in FIG. 6, the resulting $YBa_2Cu_3O_{7-x}$ exhibits a substantially improved RF resistivity over both conventional copper and over a prior art $YBa_2Cu_3O_{7-x}$ prepared by sintering and disposed on a silver substrate.

The following are nonlimiting examples of methods of preparing HTSC materials.

EXAMPLE 1

A mixture of $Y_2O_3$, CuO, and $BaCO_3$ was mixed in turn with an acrylic binder, a sorbitan trioleate dispersant, and an n-butanol/xylene solvent to make precursor 'paint'. Other suitable carrier formulations can also be used as understood in the art. This paint was then applied to a silver foil using a paint brush. The resultant dried coating was 0.008" thick. This sample was then placed in a controlled atmosphere furnace, heated in 2 torr of oxygen at 60° C./hr to 350° C. to insure adequate removal of the organic components of the paint. The atmosphere of the furnace was then changed to 0.9% $CO_2$ in nitrogen, and the sample was heated to 900° C. at a rate of about 300° C./hr. The atmosphere of the furnace was again changed to 2 torr of oxygen, and the sample was held at temperature for 1 hour. This treatment resulted in a textured, crystallized $YBa_2Cu_3O_{7-x}$ microstructure.

EXAMPLE 2

A commercial $YBa_2Cu_3O_{7-x}$ powder was mixed with an acrylic binder, a sorbitan trioleate dispersant, and an n-butanol/xylene solvent to make a precursor 'paint'. This paint was applied to a 304 stainless steel disc, a 316 stainless steel disc, and an Inconel 600 disc (all 1.125" diameter and previously electroplated with 0.002" of silver) with a paint brush. The resultant dried coating was, in all cases, about 0.004 to 0.005" thick. All three samples were then placed in a controlled atmosphere furnace, and heated in 2 torr of oxygen at 60° C./hr to 350° C. to insure proper removal of the organic components of the paint. The atmosphere of the furnace was then changed to 1.1% $CO_2$ in nitrogen, and the sample was heated to 880° C. at a rate of 300° C./hr. The atmosphere of the furnace was again changed to 2 torr of oxygen, and the furnace temperature was slowly increased at a rate of 25° C./hr to 900° C. This treatment resulted in a textured, crystallized $YBa_2Cu_3O_{7-x}$ microstructure for all samples.

EXAMPLE 3

A variety of starting materials different from those used in Examples 1 and 2 also proved satisfactory. These starting materials included: (1) phase pure $YBa_2Cu_3O_{7-x}$ with 22% $Y_2BaCuO_5$, (2) $YBaSrCu_3O_{7-x}$ with 22% $Y_2BaCuO_5$, (3) a CuO rich commercially available $YBa_2Cu_3O_{7-x}$ and stoichiometric $YBa_2Cu_3O_{7-x}$. All of these starting materials were used successfully in implementing the methods described in Examples 1 and 2.

EXAMPLE 4

Any one of the above example procedures was followed and the pattern of the original starting material remained substantially the same after preparing $YBa_2Cu_3O_{7-x}$. This was compared to conventionally prepared $YBa_2Cu_3O_{7-x}$ (peritectic processing) which showed substantial liquid flowage and loss of the spatial pattern of the original starting material.

What is claimed is:

1. A superconductor material and composite structure, comprising 123YBaCu-oxide disposed on a silver substrate, said 123YBaCu-oxide formed by heating a mixture of Y-, Ba- and Cu-compounds to a temperature not exceeding the peritectic point of said 123YBaCu-Oxide, providing an oxidizing atmosphere and not exceeding the melting point of said silver substrate while forming said 123YBaCu-oxide disposed on said silver substrate said 123YBaCu-Oxide having a textured structure with a c-axis orientation.

2. The superconductor material as defined in claim 1 wherein said silver substrate is selected from the group consisting of silver and silver coated base metal.

3. An intermediate product of a 123YBaCu-oxide superconductor, comprised of:

a pseudo-binary of $Y_2BaCuO_2$/3 BaO0.5CuO existing at a temperature range not exceeding about 850° C.–975° C. and held in an oxidizing atmosphere, said pseudo-binary having a solid pattern without substantial liquid flowage characteristics in said temperature range.

4. The intermediate product as defined in claim 3 wherein said oxidizing atmosphere comprises a partial pressure of $CO_2$.

5. The intermediate product as defined in claim 3 wherein said oxidizing atmosphere comprises about 1 torr to 1 atmosphere of oxygen gas.

6. The intermediate product as defined in claim 3 further including a substrate coupled to said intermediate product.

7. The intermediate product as defined in claim 6 wherein said substrate is selected from the group consisting of silver and a base metal having a silver layer thereon.

8. The intermediate product as defined in claim 7 wherein said substrate base metal is coupled to an electroplated layer selected from the group consisting of silver and silver with a nickel intermediate layer.

9. The intermediate product as defined in claim 7 where said base metal is selected from the group consisting of stainless steel and Inconel.

10. The intermediate product as defined in claim 3 wherein said solid pattern comprises an intricate pattern.

11. A 123YBaCu-oxide superconductor structure, comprised of:

a 123YBaCu-oxide superconductor disposed on a silver-containing substrate and having a textured structure with a c-axis orientation, said 123YBaCu-oxide superconductor being produced by the steps of:

(a) preparing a mixture of superconductor material constituents for achieving proper composition for said 123YBaCu-oxide superconductor;

(b) heating said superconductor material mixture to a temperature no greater than the melting point of silver in a first atmosphere having a partial pressure of $CO_2$; and (c) controlling decomposition of at least one of said superconductor material constituents thereby suppressing decomposition of $BaCO_3$, as well as enabling decomposition and suppressing formation of 123YBaCu-oxide precursor and changing said first atmosphere to a second atmosphere consisting essentially of an oxidizing gas to decompose at least one of said superconductor material constituents and heating said superconductor material constituents to a temperature not to exceed the melting point of silver to form said 123YBaCu-oxide superconductor.

12. The structure as defined in claim 11 wherein said mixture of superconductor material constituents comprises a single phase 123-oxide powder.

13. The structure as defined in claim 11 wherein said second atmosphere comprises about one torr to one atmosphere of oxygen gas.

14. A superconductor structure of a superconductor material formed from an intermediate product having a substantially solid pattern in a pseudo-binary system of $Y_2BaCuO_2/3BaO0.5CuO$, including starting constituents capable of yielding a 123YBaCu-oxide, the starting constituents being heated in a $CO_2$ containing atmosphere and heating further the starting constituents to a temperature range not exceeding the melting point of silver in an oxidizing atmosphere to form the intermediate product, including a eutectic liquid and a solid phase, and having the substantially solid pattern without substantial liquid flowage characteristics in a temperature range not exceeding the melting point of silver, said superconductor material being disposed on a silver-containing substrate to form said superconductor structure having a textured structure with a c-axis orientation, and said superconductor structure comprised of 123YBaCu-oxide formed on said substrate without exceeding the melting point of silver and also disposed on said silver-containing substrate without interdiffusion between the 123YBaCu-oxide and said silver-containing substrate.

* * * * *